United States Patent
Sanada

(10) Patent No.: US 12,389,563 B2
(45) Date of Patent: Aug. 12, 2025

(54) COOLING APPARATUS FOR ELECTRONIC DEVICE

(71) Applicant: TOSHIBA TEC KABUSHIKI KAISHA, Tokyo (JP)

(72) Inventor: Tsuyoshi Sanada, Susono Shizuoka (JP)

(73) Assignee: TOSHIBA TEC KABUSHIKI KAISHA, Tokyo (JP)

( * ) Notice: Subject to any disclaimer, the term of this patent is extended or adjusted under 35 U.S.C. 154(b) by 221 days.

(21) Appl. No.: 18/361,946

(22) Filed: Jul. 31, 2023

(65) Prior Publication Data
US 2024/0155804 A1 May 9, 2024

(30) Foreign Application Priority Data

Nov. 8, 2022 (JP) .................................. 2022-178622

(51) Int. Cl.
*H05K 7/20* (2006.01)
*G06F 1/20* (2006.01)

(52) U.S. Cl.
CPC ......... *H05K 7/20145* (2013.01); *G06F 1/203* (2013.01); *H05K 7/20154* (2013.01); *H05K 7/2039* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,785,145 B1 * | 8/2004 | Wong | ........................ | G06F 1/20 361/752 |
| 6,940,716 B1 * | 9/2005 | Korinsky | ................... | G06F 1/20 361/679.48 |
| 7,255,532 B2 * | 8/2007 | Zheng | ..................... | F04D 17/16 415/203 |
| 7,872,866 B1 * | 1/2011 | Wang | ........................ | G06F 1/20 361/679.48 |

(Continued)

FOREIGN PATENT DOCUMENTS

| | | |
|---|---|---|
| JP | 2003-283171 | 10/2003 |
| JP | 2021-185592 | 12/2021 |

OTHER PUBLICATIONS

Extended European Search Report for European Patent Application No. 23196183.0 dated Feb. 13, 2024.

*Primary Examiner* — Lisa Lea-Edmonds
(74) *Attorney, Agent, or Firm* — Amin, Turocy & Watson, LLP

(57) ABSTRACT

A cooling apparatus for an electronic device includes a branch wall provided in a duct and divides an exhaust direction from an exhaust port into two. The branch wall is inclined such that two plate-shaped portions continuous with each other on one side are separated from each other. A plurality of the branch ribs is provided side by side in a thickness direction and protrudes from the branch wall. The branch ribs have a mountain shaped plate shape with a most protruding top portion having an acute angle. The branch ribs are inserted into gaps between the fins. The main rib, among the plurality of branch ribs, is adjacent to the fin erected on a back surface of the base portion at a position in contact with the electronic component, and has a volume larger than that of the other branch ribs.

20 Claims, 6 Drawing Sheets

(56) References Cited

U.S. PATENT DOCUMENTS

| | | | | |
|---|---|---|---|---|
| 7,961,462 B2* | 6/2011 | Hernon | ............. | H05K 7/20145 |
| | | | | 361/694 |
| 7,986,521 B2* | 7/2011 | Hung | .................... | H01L 23/467 |
| | | | | 257/722 |
| 8,081,459 B2* | 12/2011 | Doll | .......................... | G06F 1/20 |
| | | | | 361/698 |
| 8,448,695 B2* | 5/2013 | Tang | ......................... | G06F 1/20 |
| | | | | 165/80.3 |
| 8,737,070 B2* | 5/2014 | Zhu | ........................... | G06F 1/20 |
| | | | | 361/679.48 |
| 8,941,987 B2* | 1/2015 | Makley | ..................... | G06F 1/20 |
| | | | | 165/104.11 |
| 10,299,403 B2* | 5/2019 | Janak | ................ | H05K 7/20145 |
| 11,310,936 B2* | 4/2022 | Saroor | .................... | G06F 1/203 |
| 2007/0165374 A1* | 7/2007 | Chen | ..................... | H01L 23/467 |
| | | | | 257/E23.099 |
| 2008/0055853 A1* | 3/2008 | Lin | .......................... | G06F 1/20 |
| | | | | 257/E23.099 |
| 2010/0053884 A1* | 3/2010 | Hung | ....................... | G06F 1/20 |
| | | | | 165/104.34 |
| 2010/0128431 A1* | 5/2010 | Eriksen | ..................... | G06F 1/20 |
| | | | | 29/890.035 |
| 2011/0141686 A1* | 6/2011 | Liu | ..................... | H01L 23/3672 |
| | | | | 361/679.47 |
| 2013/0155606 A1* | 6/2013 | Sasaki | ................... | H01L 23/467 |
| | | | | 361/679.47 |
| 2016/0282065 A1* | 9/2016 | Mitsui | ................... | H01L 23/467 |
| 2017/0112018 A1* | 4/2017 | Krivonak | ........... | H05K 7/20927 |
| 2024/0049420 A1* | 2/2024 | Sanada | ............. | H05K 7/20145 |
| 2024/0049421 A1* | 2/2024 | Sanada | ............. | H05K 7/20154 |
| 2024/0155804 A1* | 5/2024 | Sanada | ............. | H05K 7/20145 |
| 2024/0155805 A1* | 5/2024 | Sanada | ............. | H05K 7/20154 |
| 2024/0155812 A1* | 5/2024 | Sanada | ............. | G06F 1/20 |
| 2024/0155813 A1* | 5/2024 | Sanada | ............. | H05K 7/20172 |
| 2024/0206109 A1* | 6/2024 | Sanada | .................. | G06F 1/206 |
| 2024/0206110 A1* | 6/2024 | Sanada | ............. | H05K 7/20145 |
| 2024/0206111 A1* | 6/2024 | Sanada | ............. | H05K 7/20145 |
| 2024/0206114 A1* | 6/2024 | Sanada | ............. | H05K 7/20154 |

* cited by examiner

COOLING APPARATUS FOR ELECTRONIC DEVICE

CROSS-REFERENCE TO RELATED APPLICATION

This application is based upon and claims the benefit of priority from Japanese Patent Application No. 2022-178622, filed on Nov. 8, 2022, the entire contents of which are incorporated herein by reference.

FIELD

Embodiments described herein relate to a cooling apparatus for an electronic device.

BACKGROUND

In the related art, an electronic device such as a personal computer (PC) includes a component whose temperature may increase, such as a central processing unit (CPU). In general, a heat sink is attached to such a component for heat dissipation, a fan and a duct are disposed such that gas (air) around the heat sink appropriately flows, and positions of suction and exhaust holes of the duct are determined.

Here, depending on an amount, an arrangement, and the like of components built in a housing of an electronic device, a component (obstacle) that prevents gas from smoothly passing through may be disposed on a leeward side of the fan. In this case, a heat dissipation performance deteriorates, which is not preferable.

A general fan for such an application is an axial flow fan (propeller fan), and a wind speed tends to be slow in a region downstream of a rotation shaft due to a mechanism of the axial flow fan. Alternatively, in general, an electronic component which is a target of heat dissipation by the heat sink is disposed to be in contact with a central portion of a base portion, and a temperature of a fin erected on the portion is likely to be higher than that of the other fins. When the electronic component is in contact with a plurality of portions of the base portion, the temperature of the fins at the dispersed portions is high.

DETAILED DESCRIPTION

An aspect of embodiments is to provide a cooling apparatus for an electronic device which can obtain a high heat dissipation performance when there is an obstacle on a leeward side of a fan that blows air for heat dissipation.

A cooling apparatus for an electronic device according to an embodiment includes a heat sink, a fan, a duct, a branch wall, branch ribs, and a main rib. In the heat sink, a plurality of fins is erected side by side in a thickness direction on a base portion that receives heat of an electronic component. The fan generates an air flow between the fins by air blowing caused by rotation. The duct covers the heat sink and the fan and is provided with an intake port upstream and an exhaust port downstream in an air blowing direction of the fan. The branch wall is provided in the duct and divides an exhaust direction from the exhaust port into two. The branch wall is inclined with respect to the air blowing direction of the fan such that two plate-shaped portions continuous with each other on one side are separated from each other toward a downstream side in the air blowing direction. A plurality of the branch ribs is provided side by side in a thickness direction and protrudes from the branch wall. The branch ribs have a mountain shaped plate shape with a most protruding top portion having an acute angle and to be inserted into gaps between the fins. The main rib, among the plurality of branch ribs, is adjacent to the fin erected on a back surface of the base portion at a position in contact with the electronic component, and has a volume larger than that of the other branch ribs.

First Embodiment

Figure 1:
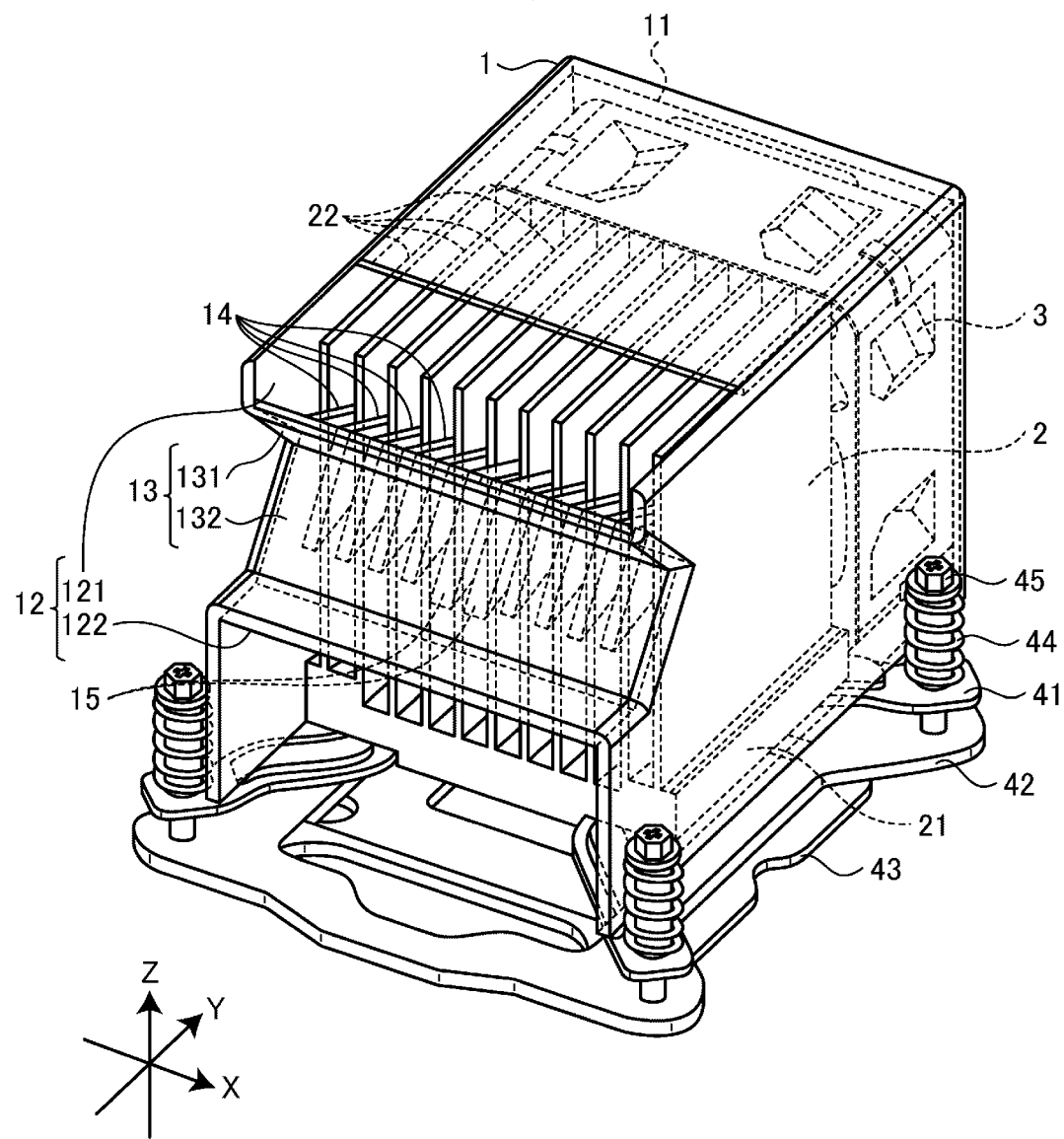
FIG. 1 is a perspective view illustrating an example of an appearance of a duct according to a first embodiment.
Figure 2:
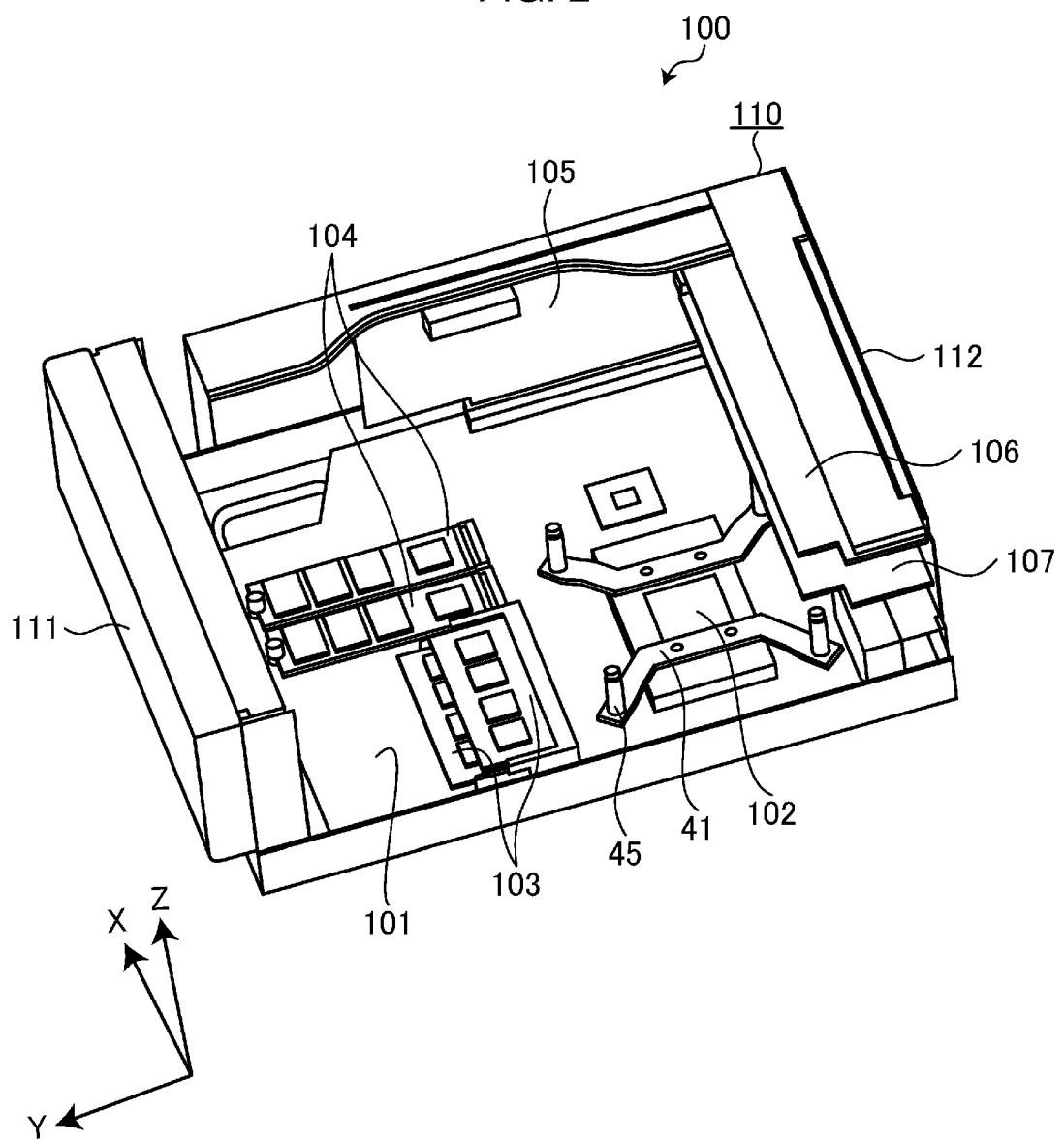
FIG. 2 is a perspective view schematically illustrating an example of a structure of an electronic device to which a duct is attached.

An embodiment will be described with reference to the drawings. FIG. 1 is a perspective view illustrating an example of an appearance of a cooling apparatus 200 according to a first embodiment. FIG. 2 is a perspective view schematically illustrating an example of a structure of an electronic device 100 to which the cooling apparatus 200 is attached. Here, for convenience of description, a three-dimensional coordinate system is also shown in the drawings. In the three-dimensional coordinate system, a width direction (left-right direction) of the cooling apparatus 200 and the electronic device 100 is an X-axis direction, a depth direction (front-rear direction) is a Y-axis direction, and a height direction (up-down direction) is a Z-axis direction. A positive direction of a Y-axis is a direction from a rear side to a front side of the electronic device 100, and the positive direction of the Y-axis is referred to as "front". A positive direction of a Z-axis is a direction from bottom to top.

First, as shown in FIG. 1, the cooling apparatus 200 includes a duct 1, a heat sink 2, and a fan 3. The duct 1 has a substantially box shape and covers the heat sink 2 and the fan 3 for blowing air to the heat sink 2. The fan 3 blows air in a negative direction (rearward) of the Y-axis. In the duct 1, an intake port 11 is provided upstream, and an exhaust port 12 is provided at downstream in an air blowing direction of the fan 3.

Hereinafter, the term "upstream" simply means an upstream side (windward side) based on the air blowing direction of the fan 3 (the negative direction of the Y-axis). Similarly, the term "downstream" simply means a downstream side (leeward side) based on the air blowing direction of the fan 3.

The heat sink 2 is attached to a heat-generating electronic component. The "heat-generating electronic component" is, for example, a central processing unit (CPU). Heat generated by the CPU is conducted to the heat sink 2, and the heat of the heat sink 2 is dissipated to surrounding gas (air). Accordingly, malfunction and the like due to overheating of the CPU is prevented.

The heat sink 2 includes a base portion 21 and a plurality of fins 22. The base portion 21 is subjected to conduction of heat generated by the electronic component. The plurality of fins 22 are erected on the base portion 21 side by side in a thickness direction. The plurality of fins 22 are adjacent to each other at a predetermined interval. The base portion 21 is in contact with the CPU, and the heat of the CPU is conducted. The fins 22 dissipate, into air, heat conducted from the base portion 21 connected to the fins 22.

The heat sink 2 is fixed onto frames 41 to 43, which are layered at predetermined intervals, by helical springs 44 and screws 45. A motherboard 101 (see FIG. 2) is sandwiched between the frame 41 and the frame 42.

The fan 3 is an axial flow fan, and is a propeller fan including one or more propellers around a rotation shaft. The fan 3 is a rotating propeller and continuously sends air. Air blowing caused by the rotation of the fan 3 generates an air flow between the fins 22. The air sent by the fan 3 carries heat dissipated by the fins 22 and the base portion 21 to the downstream side, and promotes heat dissipation. Accordingly, the fan 3 cools the heat sink 2.

In the present embodiment, the intake port 11, the fan 3, the heat sink 2, and the exhaust port 12 are disposed in this order from the upstream side to the downstream side in the air blowing direction of the fan 3. The gas (air) taken in from the intake port 11 by the fan 3 flows mainly around the fins 22 of the heat sink 2 to take heat of the fins 22, and is exhausted from the exhaust port 12.

The duct 1 allows the air blown by the fan 3 to efficiently act on the heat dissipation of the heat sink 2 to improve a heat dissipation effect. Specifically, the duct 1 surrounds a periphery of the heat sink 2 and partitions a range in which the air sent by the fan 3 for cooling the heat sink 2 flows. Gas in the duct 1 is replaced with the gas taken in from the intake port 11 by the rotation of the fan 3, and is pushed out from the exhaust port 12. Accordingly, the gas around the heat sink 2 is quickly replaced.

For the convenience of an operation of the cooling apparatus 200 as described above, it is desirable that no component (obstacle) that interferes with the exhaust is present on the leeward side of the exhaust port 12. However, an obstacle may be disposed downstream of the exhaust port 12 depending on a size of the electronic device 100 including the cooling apparatus 200, an arrangement of built-in components, and the like.

As shown in FIG. 2, the electronic device 100 includes the motherboard 101, a CPU 102, a memory 103, a solid state drive (SSD) 104, a riser card 105, expansion boards 106 and 107 such as I/O boards, and a housing 110.

The housing 110 houses the above-described units (the motherboard 101, the CPU 102, the memory 103, the SSD 104, the riser card 105, and the expansion boards 106 and 107 such as I/O boards).

The motherboard 101 is an example of a substrate on which electronic components (the CPU 102 in the present embodiment) that dissipate heat by the heat sink 2 are mounted. The memory 103 and the SSD 104 also generate heat according to operations. This heat is also dissipated by a flow of gas in the housing 110 generated by the air blown by the fan 3.

Although the expansion boards 106 and 107 can be directly connected to the motherboard 101, in this case, since the expansion boards 106 and 107 stand upright on the motherboard 101, a dimension of the housing 110 in the height direction is necessary increased, and a size of the electronic device 100 increases. In order to prevent the above problem, the riser card 105 is used.

The riser card 105 mediates connection between the expansion boards 106 and 107 and the motherboard 101. The riser card 105 has one or more slots for receiving insertion of the expansion boards 106 and 107, and is inserted into a slot of the motherboard 101. Due to the riser card 105, the expansion boards 106 and 107 are positioned substantially parallel to and connected to the motherboard 101 without standing upright on the motherboard 101. Accordingly, a height dimension of the housing 110 can be reduced.

With the above-described arrangement, the expansion boards 106 and 107 are positioned downstream of the exhaust port 12 in the air blowing direction of the fan 3. In this case, if an exhaust direction from the exhaust port 12 is temporarily backward (the negative direction of the Y-axis), the expansion boards 106 and 107 become obstacles that interfere with the exhaust. In the present embodiment, the exhaust direction is configured to avoid the expansion boards 106 and 107.

Figure 3:
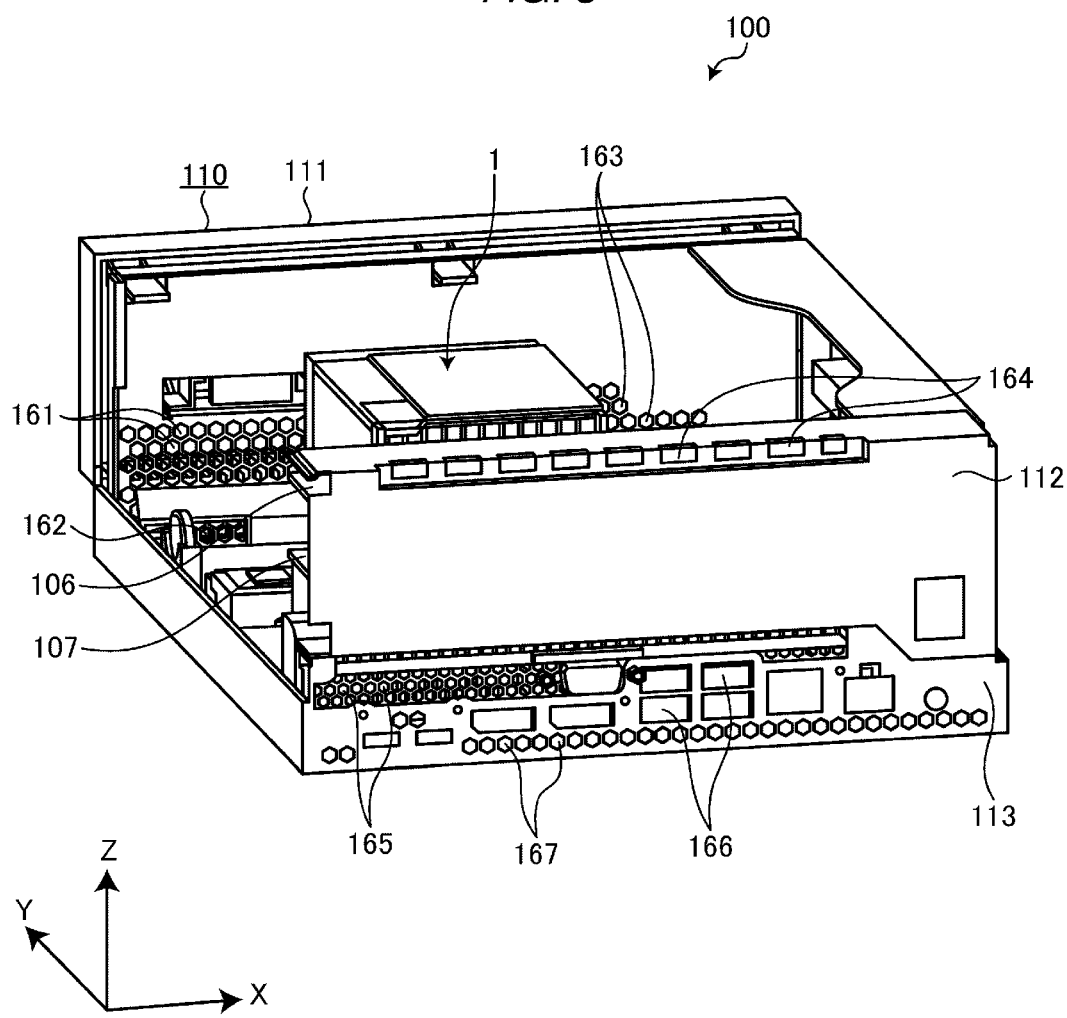
FIG. 3 is a perspective view illustrating an example of vent holes.

FIG. 3 is a perspective view illustrating an example of vent holes 161 to 167 provided in the electronic device 100. The perspective view is a view of the electronic device 100 as viewed from the rear side.

The electronic device 100 includes the duct 1, the heat sink 2 and the fan 3 covered with the duct 1, the motherboard 101, and the housing 110. The housing 110 houses the motherboard 101 and the duct 1, and the housing 110 has the vent holes 161 to 167 for sucking and exhausting air.

The housing 110 includes a front cover 111, a rear cover 112, and an I/O panel 113. The front cover 111 is a part constituting a front surface of the housing 110. The front cover 111 has the vent holes 161 to 163. The rear cover 112 is a part constituting a rear surface of the housing 110. The rear cover 112 has the vent holes 164 and 165. The vent hole 164 is positioned in an upper portion of the rear surface of housing 110. The vent hole 165 is positioned in a lower portion of the rear surface of housing 110.

The I/O panel 113 constitutes a part of the rear surface of the housing 110. The I/O panel 113 has the vent holes 166 and 167. The vent holes 166 and 167 are positioned in the lower portion of the rear surface of the housing 110. The vent hole 166 is an opening portion for receiving insertion of a connector into the I/O boards (the expansion boards 106 and 107).

Each of the vent holes 161 to 167 sucks or exhausts gas (air). Among them, the vent holes 164 to 166 provided on the rear side of the housing 110 are mainly responsible for exhaust.

In the electronic device 100 according to the present embodiment, the expansion boards 106 and 107 are disposed behind the CPU 102. Therefore, the exhaust port 12 of the duct 1 is divided by a branch wall 13 and branch ribs 14 and 15 into an exhaust port 121 that opens toward the rear upper side and an exhaust port 122 that opens toward the rear lower side such that the exhaust avoids the expansion boards 106 and 107 (see FIG. 1).

Figure 4:
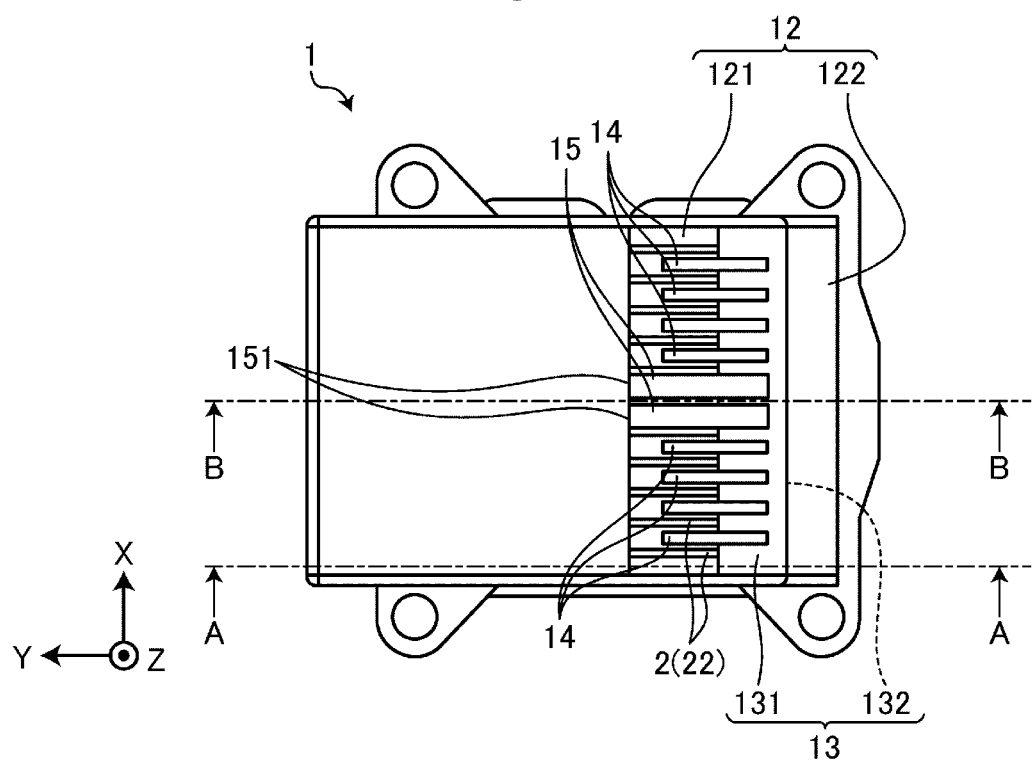
FIG. 4 is a plan view illustrating a shape of the duct.
Figure 5:
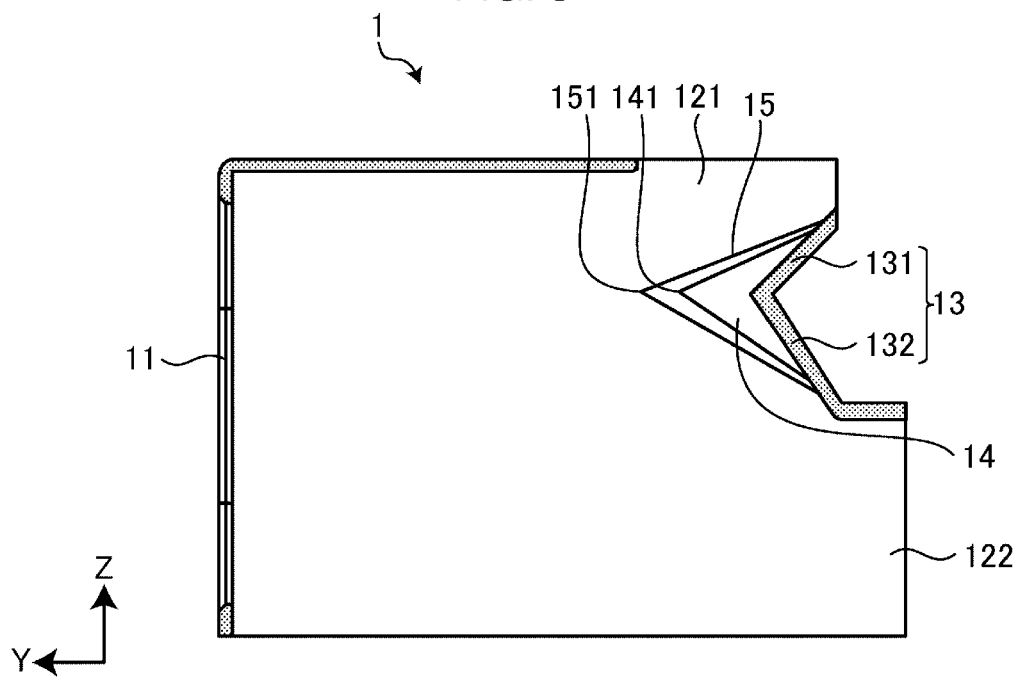
FIG. 5 is a longitudinal sectional side view illustrating the shape of the duct.

Here, shapes of the branch wall 13 and the branch ribs 14 and 15 will be described in more detail with reference to FIGS. 4 and 5. FIG. 4 is a plan view illustrating the shape of the duct 1. FIG. 5 is a longitudinal sectional side view illustrating the shape of the duct 1. A cross-sectional position of FIG. 5 is a position of a line AA illustrated in FIG. 4.

The branch wall 13 is disposed on an inner side of an edge of the exhaust port 12, and divides the exhaust port 12 into the exhaust port 121 and the exhaust port 122. The branch wall 13 has a substantially V-shaped cross section in a side view, and a bent portion of the branch wall 13 protrudes toward the heat sink 2. Accordingly, a flow direction of the gas passing through the heat sink 2 is divided into two.

More specifically, the branch wall 13 includes two plate-shaped portions 131 and 132. The plate-shaped portions 131 and 132 are continuous with each other at the upstream side thereof. In addition, the plate-shaped portions 131 and 132 are inclined with respect to the air blowing direction of the fan 3 such that a distance between the plate-shaped portions 131 and 132 increases toward the downstream side. The first plate-shaped portion 131 guides the flow direction of the gas obliquely upward. The second plate-shaped portion 132 guides the flow direction of the gas obliquely downward. Accordingly, the branch wall 13 guides exhaust gas such that the exhaust gas avoids a partial range downstream of the branch wall 13, and branches the exhaust gas.

An angle formed by each of the two plate-shaped portions 131 and 132 of the branch wall 13 and the air blowing direction of the fan 3 (the negative direction of the Y-axis) is 45° or more, and an angle formed by the two plate-shaped portions 131 and 132 is a right angle (90°) or an obtuse angle slightly larger than the right angle. An angle setting and the like of the branch wall 13 are determined in consideration of a life and ease of manufacturing of a mold.

The branch ribs 14 and 15 are erected on a surface of the branch wall 13 on the heat sink 2 side. A plurality of the branch ribs 14 and 15 is provided side by side in the left-right direction at substantially regular intervals. More specifically, the plurality of branch ribs 14 and 15 are provided side by side in a thickness direction thereof at intervals to be inserted between the fins 22. At least tip end portions of the branch ribs 14 and 15 are inserted between the fins 22.

The branch ribs 14 and 15 protrude from a surface of the branch wall 13 facing the heat sink 2 by a distance larger than an interval between the branch wall 13 and the heat sink 2. Each of the branch ribs 14 and 15 has a thickness equal to or smaller than the interval between the fins 22 of the heat sink 2, and has a substantially mountain shaped plate shape. A shape of an edge of the mountain shape of each of the branch ribs 14 and 15 may be linear or curved.

The edges of the mountain shapes of the branch ribs 14 and 15 are inclined with respect to the air blowing direction. An angle formed by the air blowing direction of the fan 3 (the negative direction of the Y-axis) and the edge of the mountain shape of each of the branch ribs 14 and 15 is effectively in a range of 20° to 45°, and more preferably about 30°. An angle of the mountain shape at a top portion 141, which is the most protruding portion, is an acute angle.

An angle setting and the like of the branch ribs 14 and 15 described above are determined based on a result of simulation of a cooling effect such that a desired effect can be obtained and a mold can be designed.

For example, if the angle formed by the air blowing direction of the fan 3 and the edge of the mountain shape of each of the branch ribs 14 and 15 is too large, a desired effect cannot be obtained. In order to obtain a desired effect, it is desirable to set the angle to at least 45° or less.

If the angle formed by the air blowing direction of the fan 3 and the edge of the mountain shape of each of the branch ribs 14 and 15 is too small (for example, less than 20°), the top portions 141 of the branch ribs 14 and 15 become too sharp, and a filling failure is likely to occur during mold forming. Therefore, a too small angle is not preferred. Further, in this case, if the branch ribs 14 and 15 are made long (a dimension from the top portion 141 to a root is large) in order to sufficiently secure a dimension of the root in the height direction, the branch ribs 14 and 15 do not fall within the exhaust port 121 in a plan view (viewpoint in a negative direction of the Z-axis), and a structure of the mold becomes complicated.

In order to obtain a desired effect by avoiding the above-described inconvenience and to form by a mold having a simple structure in which a filling failure is unlikely to occur, the angle formed by the air blowing direction of the fan 3 and the edge of the mountain shape of each of the branch ribs 14 and 15 is desirably 20° or more and 45° or less, and is preferably about 30°.

If thicknesses of the roots of the branch ribs 14 and 15 are 3 mm or less, sink marks are less likely to occur, and there is no need to perform thinning on a mold. Since there is no wall above and below the branch ribs 14 and 15, the branch ribs 14 and 15 can be molded with a normal cavity and core. Accordingly, tip ends of the branch ribs 14 and 15 can be formed into a sharp shape.

Here, differences between the branch ribs 14 and the branch ribs 15 will be described. The branch rib 14 has a thickness less than the interval between the fins 22 of the heat sink 2, and the branch rib 15 has a thickness substantially equal to the interval between the fins 22 of the heat sink 2.

The branch rib 15 is an example of a main rib and has a volume larger than that of the other branch ribs 14. The branch rib 15 according to the present embodiment is thick enough to be in contact with the adjacent fins 22. A protruding length of the branch rib 15 from the branch wall 13 is longer than a protruding length of the other branch ribs 14.

The branch rib 15 among the plurality of branch ribs 14 is provided at a position adjacent to the fin 22 whose temperature is likely to increase. The fin 22 whose temperature is likely to increase is erected on a back surface of the base portion 21 at a position in contact with a heat-generating electronic component. In the present embodiment, it is assumed that an electronic component is in contact with a central portion of the base portion 21. The branch rib 15 is provided in a central portion in an arrangement direction (X-axis direction) of the branch ribs 14 and is adjacent to the fin 22 erected on a central portion of the heat sink 2.

The duct 1 including the branch ribs 14 and 15 is formed of a material having high thermal conductivity. The material having high thermal conductivity is, for example, a material called a high thermal conductivity resin. The high thermal conductivity resin is a resin having high thermal conductivity. Instead of the entire duct 1, a part of the duct 1 (for example, the branch wall 13, the branch rib 14, and the branch rib 15, or at least the branch rib 15) may be made of a metal (for example, copper or aluminum) having high thermal conductivity. By forming the branch ribs 14 and 15 made of the material having high thermal conductivity, heat dissipation from the branch ribs 14 and 15 and each part of the duct 1 connected to the branch ribs 14 and 15 can also be expected.

Figure 6:
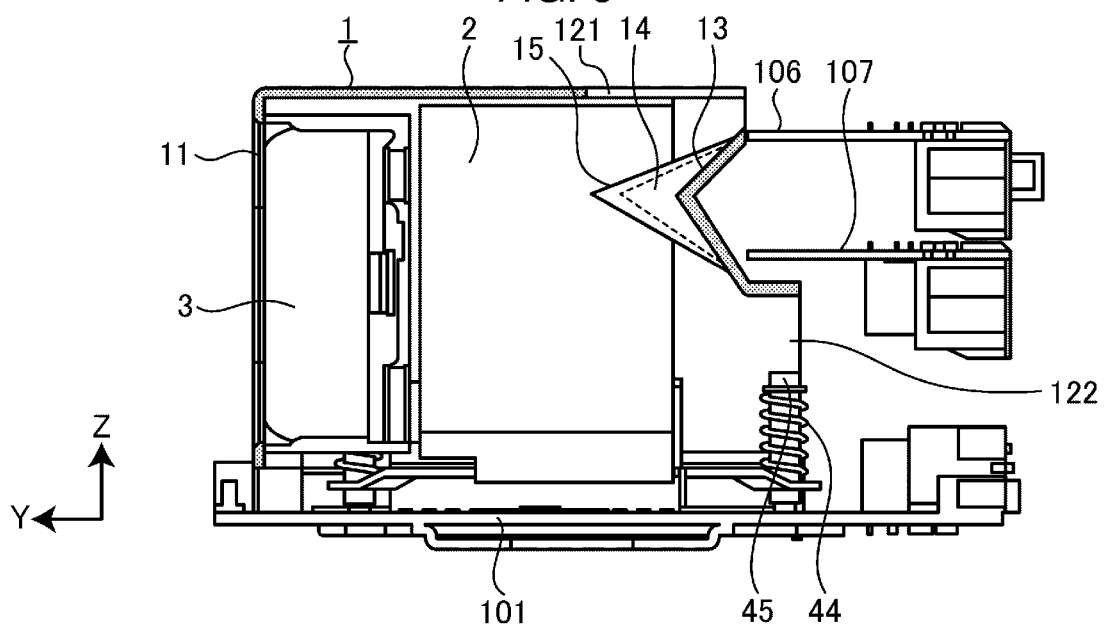
FIG. 6 is a longitudinal sectional side view illustrating a positional relationship between the duct and components near an exhaust port.

FIG. 6 is a longitudinal sectional side view illustrating a positional relationship between the duct 1 and components (the expansion boards 106 and 107) near the exhaust port 12 (121 and 122). A cross-sectional position of FIG. 6 is a position of a line B-B illustrated in FIG. 4. As illustrated here, the exhaust directions of the exhaust ports 121 and 122 are set to avoid the near components (the expansion boards 106 and 107) such that the exhaust gas passes around the components.

In such a configuration, when the electronic device 100 is energized and operated, the CPU 102, the SSD 104, and the like generate heat, and the temperature rises. When the fan 3 is operated to blow air, the gas in the duct 1 and the housing 110 flows and ventilation is performed. Therefore, the heat of the CPU 102 and the like is removed, and overheating of the CPU 102 and the like is prevented.

The branch wall 13 and the branch ribs 14 and 15 divide the flow direction of the air, which is warmed via the heat sink 2 and exhausted from the exhaust port 12, into the exhaust port 121 and the exhaust port 122. According to the simulation, as compared to a case when the branch wall 13 and the branch ribs 14 and 15 are not provided and the ventilation is influenced by obstacles (the expansion boards 106 and 107), the ventilation is performed more efficiently if the branch wall 13 and the branch ribs 14 and 15 are provided, and heat rise of the CPU 102 and the like is prevented.

As described above, according to the duct 1, even if there is an obstacle on the leeward side of the duct 1, air can be exhausted while avoiding the obstacle, and therefore, heat generated inside the electronic device 100 can be appropriately dissipated.

In the cooling apparatus 200 as described above, since the branch ribs 14 and 15 are made of a material having high thermal conductivity, heat dissipated by the fins 22 is easily received. Accordingly, heat dissipation of the fins 22 can be promoted. Further, since the volume of the branch rib 15 is larger than that of the other branch ribs 14, the heat dissipation of the fin 22 near the branch rib 15 can be further promoted. Since the fin 22 adjacent to the branch rib 15 is erected on the back surface of the base portion 21 at the position in contact with the heat-generating electronic component, an amount of heat required to dissipate tends to be large. However, overheating can be easily avoided by promoting the heat dissipation of the branch rib 15.

The above-described embodiment can be appropriately modified and implemented by changing a part of the configuration or function of each of the above-described apparatuses. Therefore, hereinafter, modifications related to the above-described embodiment will be described as other embodiments. Hereinafter, differences from the above-described embodiment will be mainly described, and with respect to similarities to the content already described, the same reference signs are used and a detailed description thereof will be omitted. The modifications described below may be implemented individually or in combination as appropriate.

Second Embodiment

Figure 7:
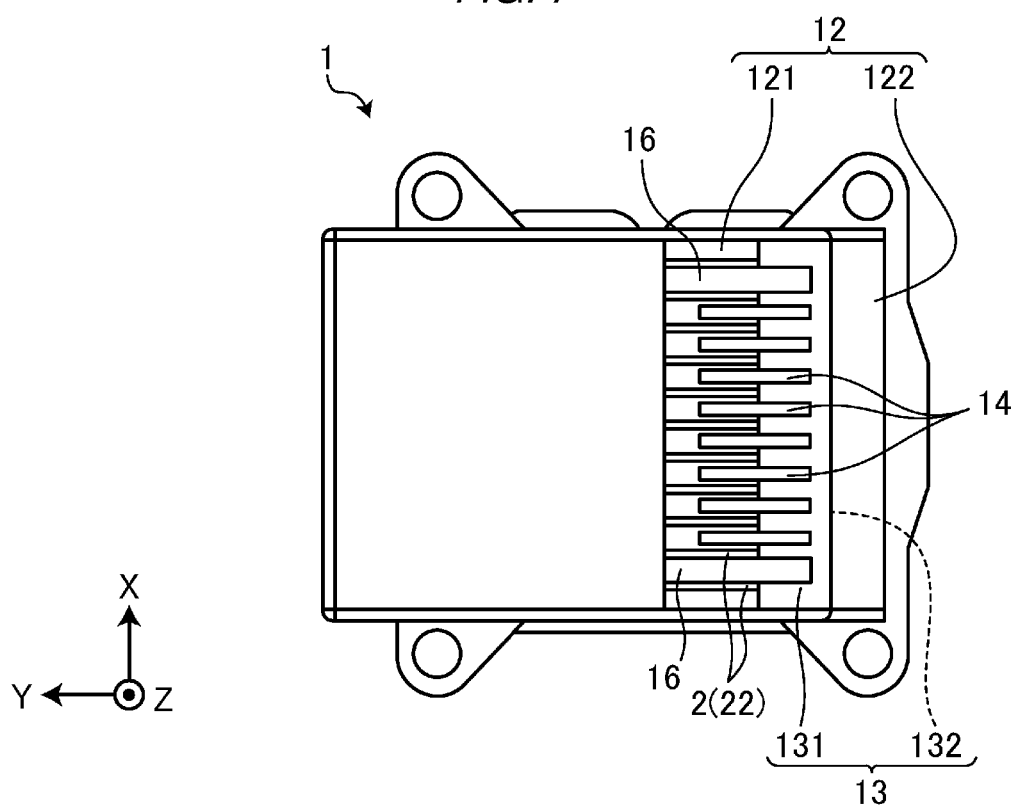
FIG. 7 is a plan view illustrating a shape of a duct according to a second embodiment.

FIG. 7 is a plan view illustrating the shape of the duct 1 according to a second embodiment. In the present embodiment, branch ribs 16 are provided as an example of main ribs instead of the branch ribs 15 according to the first embodiment.

In the present embodiment, it is assumed that a heat-generating electronic component is in contact with two positions close to ends rather than the central portion of the base portion 21. In the assumption, the temperature of the fins 22 closer to the ends is likely to become high. Therefore, the branch ribs 16, which are the main ribs, are provided at two positions which are close to the ends to promote heat dissipation of the fins 22 close to the ends.

As in the present embodiment, it is assumed that the temperature of the fins 22 is likely to become high depending on the positions of the base portion 21 with which the heat-generating electronic component is in contact. A heat dissipation performance can be improved by increasing a volume of the branch ribs 16 adjacent to the fins 22 by making the branch ribs 16 thicker or longer than that of the other branch ribs 14, and by bringing the branch ribs 16 into contact with the fins 22.

Third Embodiment

Figure 8:
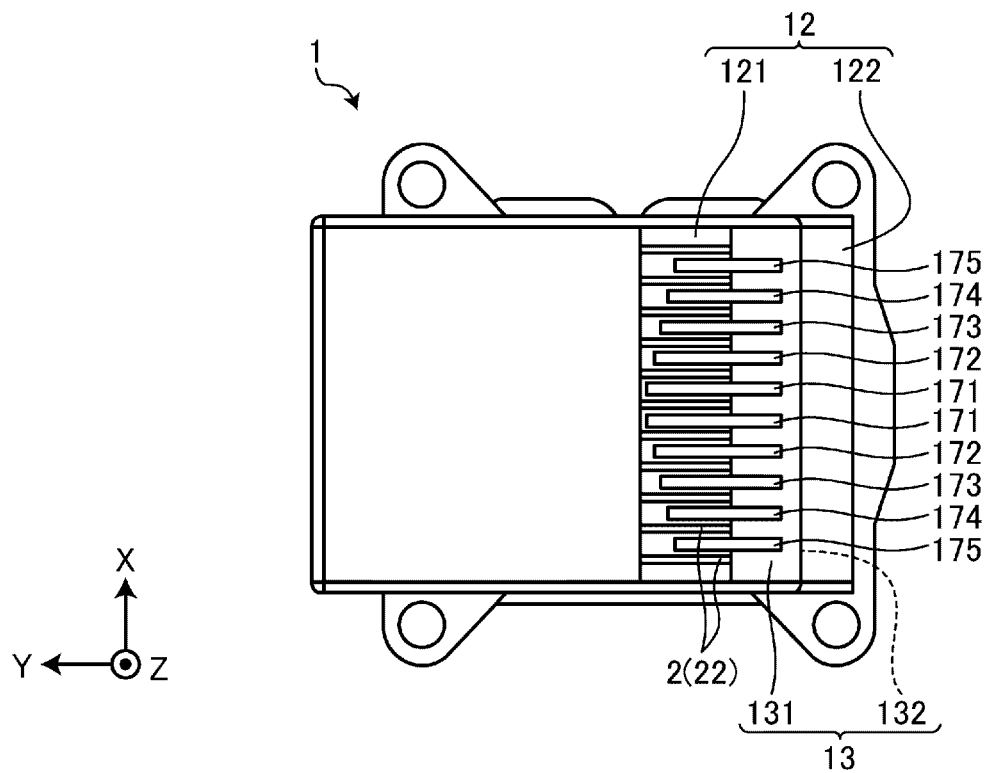
FIG. 8 is a plan view illustrating a shape of a duct according to a third embodiment.

FIG. 8 is a plan view illustrating the shape of the duct 1 according to a third embodiment. In the present embodiment, branch ribs 171 to 175 are provided instead of the branch ribs 14 and 15 according to the first embodiment. An example of the main rib in the present embodiment is the branch ribs 171.

The branch ribs 171 to 175 have different protruding lengths from the branch wall 13. The protruding lengths of the branch ribs 171 to 175 are set such that the branch ribs 171, which are the main ribs, are the longest, and the other branch ribs 172 to 175 are longer as they are closer to the branch ribs 171 and are shorter as they are farther from the branch ribs 171. The branch ribs 171 form a pair and are adjacent to the fins 22 erected on the central portion of the heat sink 2. That is, an imaginary line connecting top portions of the branch ribs 171 to 175 has a mountain shape.

According to such a configuration, since the branch ribs 171 to 175 are not in contact with the fins 22, assembly is easier than in the first embodiment, but the heat dissipation performance is lowered due to the branch ribs 171 to 175 being not in contact with the fins 22.

Fourth Embodiment

Figure 9:
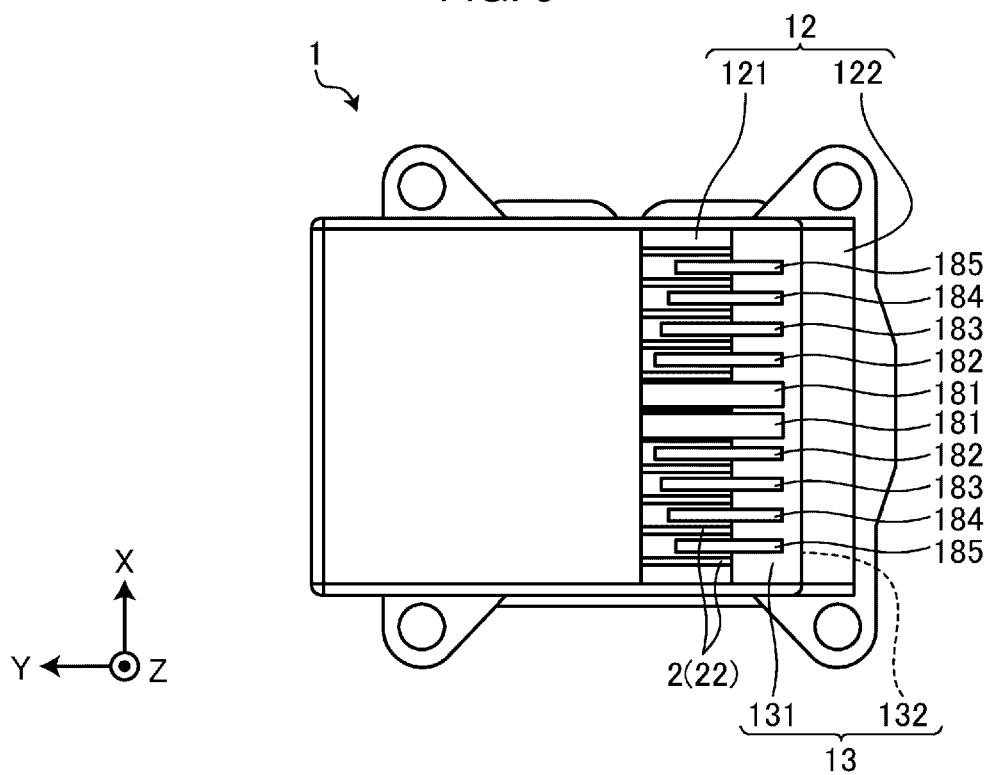
FIG. 9 is a plan view illustrating a shape of a duct according to a fourth embodiment.

FIG. 9 is a plan view illustrating the shape of the duct 1 according to a fourth embodiment. In the present embodiment, branch ribs 181 to 185 are provided instead of the branch ribs 171 to 175 according to the third embodiment. An example of the main rib in the present embodiment is the branch ribs 181. The other branch ribs 182 to 185 are the same as the branch ribs 172 to 175.

Unlike in the third embodiment, the branch ribs 181 are thick enough to be in contact with the fins 22.

According to such a configuration, the heat dissipation performance can be improved as compared with the third embodiment.

Other than in the operating examples, if any, or where otherwise indicated, all numbers, values and/or expressions referring to parameters, measurements, conditions, etc., used in the specification and claims are to be understood as modified in all instances by the term "about."

While certain embodiments have been described, these embodiments have been presented by way of examples only, and are not intended to limit the scope of the disclosure. These novel embodiments can be executed in various other forms, and various omissions, substitutions, changes, and combinations can be made within a scope not departing from the spirit of the disclosure. The embodiments and the modification thereof are included in the scope and the spirit of the disclosure and are also included in the disclosure described in the scope of claims and an equivalent scope thereof.

What is claimed is:

1. A cooling apparatus for an electronic device, comprising:
   a heat sink comprising a plurality of fins erected side by side in a thickness direction on a base portion configured to receive heat of an electronic component;
   a fan configured to generate an air flow between the plurality of fins by air blowing caused by rotation;

a duct which covers the heat sink and the fan and comprises an intake port upstream and an exhaust port downstream in an air blowing direction of the fan;

a branch wall provided in the duct and divides an exhaust direction from the exhaust port into two, the branch wall being inclined with respect to the air blowing direction of the fan such that two plate-shaped portions continuous with each other on one side are separated from each other toward a downstream side in the air blowing direction;

a plurality of branch ribs which is provided side by side in a thickness direction and protrudes from the branch wall, the plurality of branch ribs having a mountain shaped plate shape with a most protruding top portion having an acute angle and to be inserted into gaps between the plurality of fins; and a main rib, among the plurality of branch ribs, adjacent to a fin erected on a back surface of the base portion at a position in contact with the electronic component, and has a volume larger than a volume of each of the other branch ribs.

2. The cooling apparatus according to claim 1, wherein the main rib is thick enough to be in contact with the adjacent fin.

3. The cooling apparatus according to claim 1, wherein a protruding length of the main rib from the branch wall is longer than a protruding length of the other branch ribs.

4. The cooling apparatus according to claim 1, wherein the main rib is adjacent to the fin erected on a central portion of the heat sink.

5. The cooling apparatus according to claim 1, wherein a protruding length of the branch rib is set to be longer as the branch rib is closer to the main rib and to be shorter as the branch rib is farther from the main rib, and an imaginary line connecting top portions of the branch ribs has a mountain shape.

6. The cooling apparatus according to claim 1, wherein at least the main rib among the branch ribs is formed of a material having high thermal conductivity.

7. The cooling device according to claim 1, wherein the plurality of fins are adjacent to each other at a predetermined interval.

8. The cooling device according to claim 1, wherein the electronic component comprises at least one of a central processing unit, a motherboard, a memory, a solid state drive, a riser card, and an I/O board.

9. The cooling device according to claim 1, wherein the plurality of branch ribs are adjacent to each other at a predetermined interval.

10. The cooling device according to claim 1, wherein the heat sink is fixed onto two frames layered at predetermined intervals, by helical springs and screws.

11. A personal computer, comprising:
central processing unit; and
a cooling device, comprising:
 a heat sink comprising a plurality of fins erected side by side in a thickness direction on a base portion configured to receive heat of the central processing unit;
 a fan configured to generate an air flow between the plurality of fins by air blowing caused by rotation;
 a duct which covers the heat sink and the fan and comprises an intake port upstream and an exhaust port downstream in an air blowing direction of the fan;
 a branch wall provided in the duct and divides an exhaust direction from the exhaust port into two, the branch wall being inclined with respect to the air blowing direction of the fan such that two plate-shaped portions continuous with each other on one side are separated from each other toward a downstream side in the air blowing direction;
 a plurality of branch ribs which is provided side by side in a thickness direction and protrudes from the branch wall, the plurality of branch ribs having a mountain shaped plate shape with a most protruding top portion having an acute angle and to be inserted into gaps between the plurality of fins; and
 a main rib, among the plurality of branch ribs, adjacent to a fin erected on a back surface of the base portion at a position in contact with the central processing unit, and has a volume larger than a volume of each of the other branch ribs.

12. The personal computer according to claim 11, wherein the main rib is thick enough to be in contact with the adjacent fin.

13. The personal computer according to claim 11, wherein a protruding length of the main rib from the branch wall is longer than a protruding length of the other branch ribs.

14. The personal computer according to claim 11, wherein the main rib is adjacent to the fin erected on a central portion of the heat sink.

15. The personal computer according to claim 11, wherein a protruding length of the branch rib is set to be longer as the branch rib is closer to the main rib and to be shorter as the branch rib is farther from the main rib, and an imaginary line connecting top portions of the branch ribs has a mountain shape.

16. The personal computer according to claim 11, wherein at least the main rib among the branch ribs is formed of a material having high thermal conductivity.

17. The personal computer according to claim 11, wherein the plurality of fins are adjacent to each other at a predetermined interval.

18. The personal computer according to claim 11, further comprises at least one of a motherboard, a memory, a solid state drive, a riser card, and an I/O board.

19. The personal computer according to claim 11, wherein the plurality of branch ribs are adjacent to each other at a predetermined interval.

20. The personal computer according to claim 11, wherein the heat sink is fixed onto two frames layered at predetermined intervals, by helical springs and screws.

* * * * *